(12) United States Patent
Chen et al.

(10) Patent No.: US 11,865,674 B2
(45) Date of Patent: Jan. 9, 2024

(54) POSITIONING FIXTURE

(71) Applicant: PEGATRON CORPORATION, Taipei (TW)

(72) Inventors: Chun-Nan Chen, Taipei (TW); Ming-Te Lin, Taipei (TW); Chi-Ming Tsai, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 17/842,742

(22) Filed: Jun. 16, 2022

(65) Prior Publication Data

US 2023/0049869 A1 Feb. 16, 2023

(30) Foreign Application Priority Data

Aug. 16, 2021 (TW) .................................. 110130176

(51) Int. Cl.
*B25B 11/02* (2006.01)
*H05K 3/30* (2006.01)

(52) U.S. Cl.
CPC ................ *B25B 11/02* (2013.01); *H05K 3/30* (2013.01); *H05K 2203/0195* (2013.01)

(58) Field of Classification Search
CPC .. B25B 11/02; F16B 2001/0092; F16B 5/065; H01L 23/4006; H05K 1/0203; H05K 2201/10409
See application file for complete search history.

(56) References Cited

U.S. PATENT DOCUMENTS

| 2009/0325404 A1* | 12/2009 | Lin | ..................... | H01R 13/2435 |
| | | | | 439/73 |
| 2010/0087085 A1* | 4/2010 | Liu | ..................... | H01R 13/648 |
| | | | | 439/353 |
| 2023/0049869 A1* | 2/2023 | Chen | ..................... | B25B 11/02 |

FOREIGN PATENT DOCUMENTS

CN          208614639          3/2019

* cited by examiner

*Primary Examiner* — Minh N Trinh
(74) *Attorney, Agent, or Firm* — J.C. PATENTS

(57) ABSTRACT

A positioning fixture including a shielding member and a driving member is provided. The shielding member includes a sliding part slidably connected to a functional module, a guiding part, and a shielding part. The sliding part and the shielding part respectively extend from two opposite ends of the guiding part. The driving member is movably disposed on the functional module corresponding to the shielding member. The driving member includes a base part, a driving part that contacts the guiding part, and a pillar part, which protrudes from the base part and is adapted to pass through the guiding groove. When the functional module is positioned on the circuit board, the base part of the driving member is pushed by the electronic component, and the guiding part is pushed by the driving part, so that the shielding member slides and the shielding part shields a screw hole of the circuit board.

11 Claims, 5 Drawing Sheets

POSITIONING FIXTURE

CROSS-REFERENCE TO RELATED APPLICATION

This application claims the priority benefit of Taiwan application serial no. 110130176, filed on Aug. 16, 2021. The entirety of the above-mentioned patent application is hereby incorporated by reference herein and made a part of this specification.

BACKGROUND

Technical Field

The disclosure relates to a positioning fixture, and in particular relates to a positioning fixture that avoids an incorrect locking.

Description of Related Art

Generally speaking, a circuit board includes a screw hole, for a functional module (for example, a heat dissipation module) to be locked onto the circuit board. In different models of electronic devices, the specifications and dimensions of the circuit boards, the positions of the electronic components on the circuit boards, and the positions of the screw holes are different, and accordingly, the specifications and dimensions of the functional modules are also different.

In order to avoid an incorrect installation of a functional module, that applies to a certain model, to a circuit board that applies to another model, a common practice is to dispose a thick pad (such as a rubber pad) on the bottom surface of the functional module. In the case of an incorrect installation, a structural interference occurs with the thick pad and the electronic component on the circuit board, to increase the distance between the screw hole on the functional module and the screw hole on the circuit board, so that the screws may not be locked and fixed onto the two aforementioned screw holes. However, the thick pad may be squeezed and deformed. Once an installer does not detect an incorrect installation behavior and forcibly turns the screw, in the end, the functional module may still be locked onto the circuit board through the screw, but the functional modules and the electronic component on the circuit board that push each other are easily deformed or even damaged.

SUMMARY

The disclosure provides a positioning fixture, which facilitates the improvement in the installation accuracy.

The disclosure provides a positioning fixture, which is suitable for a functional module and a circuit board. The circuit board includes an electronic component and a first screw hole. The electronic component is disposed adjacent to the first screw hole. The positioning fixture includes a shielding member and a driving member. The shielding member includes a sliding part, a guiding part, and a shielding part. The sliding part is slidably connected to the functional module and extends from one end of the guiding part along a first direction. The shielding part extends from another end of the guiding part along a second direction opposite to the first direction and corresponds to the first screw hole. The sliding part includes a guiding groove. The driving member is movably disposed on the functional module corresponding to the shielding member. The driving member includes a base part, a driving part and a pillar part. The driving part contacts the guiding part. The pillar part protrudes from the base part and is adapted to pass through the guiding groove. When the functional module is positioned on the circuit board, the base part of the driving member is pushed by the electronic component, and the guiding part is pushed by the driving part, so that the shielding member slides along the second direction and the shielding part shields the first screw hole.

Based on the above, the positioning fixture of the disclosure may be integrated on the functional module. Once the functional module that applies to a certain model is incorrectly installed on the circuit board that applies to another model, the positioning fixture may be driven by the electronic component on the circuit board to block the screw hole of the circuit board and prevent the screw from being locked into the screw hole of the circuit board. That is, an incorrect installation may be detected by the installer through the positioning fixture of the disclosure, thereby improving the installation accuracy and reducing the probability of damaging the functional module and the circuit board caused by an incorrect installation.

In order to make the features and advantages above of the disclosure comprehensible, embodiments accompanied with drawings are described in detail below.

DETAILED DESCRIPTION OF DISCLOSED EMBODIMENTS

Figure 1:
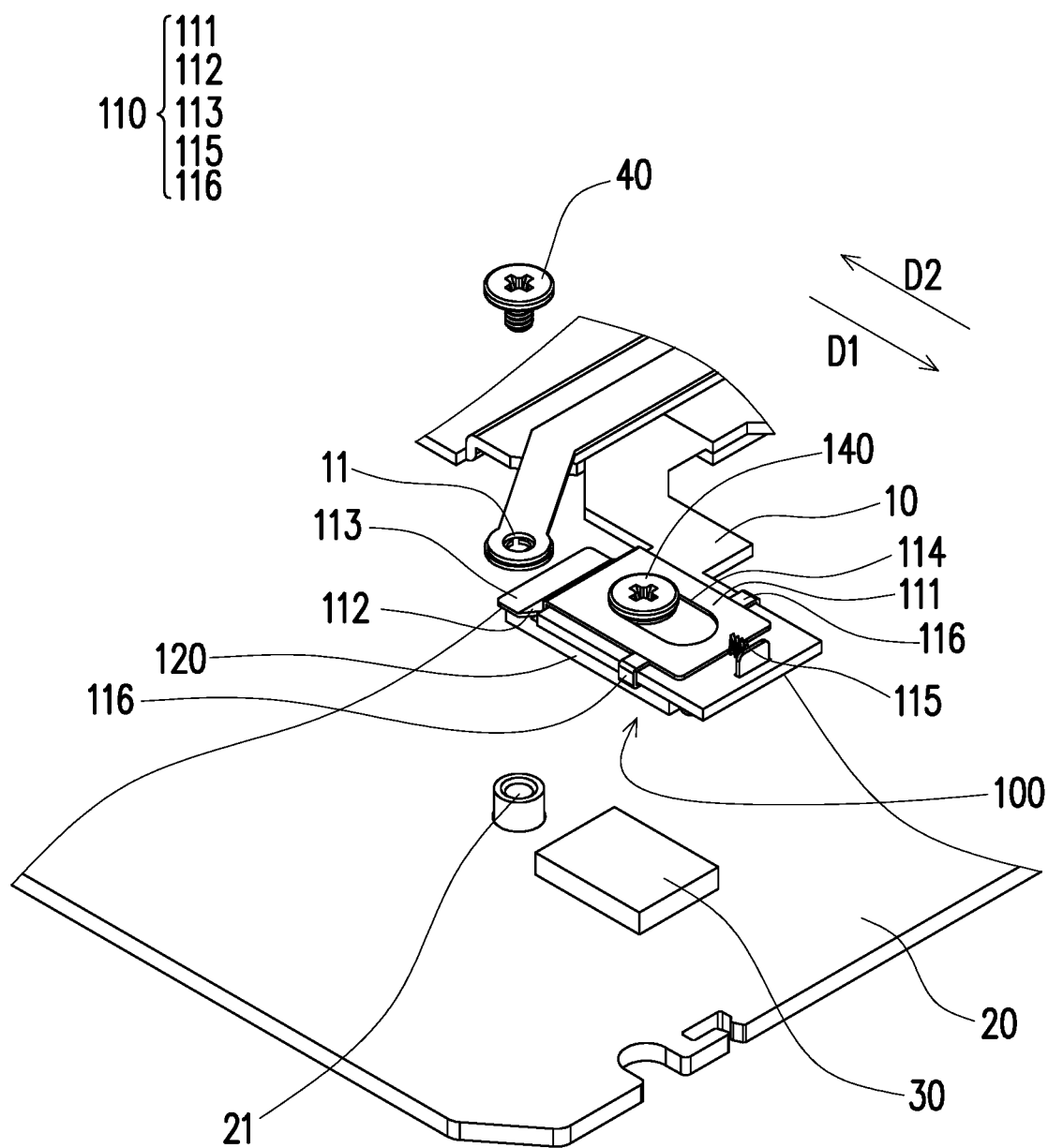
FIG. 1 and FIG. 2 are partial schematic views of a positioning fixture configured to assist in the installation of a functional module and a circuit board according to an embodiment of the disclosure.
Figure 2:
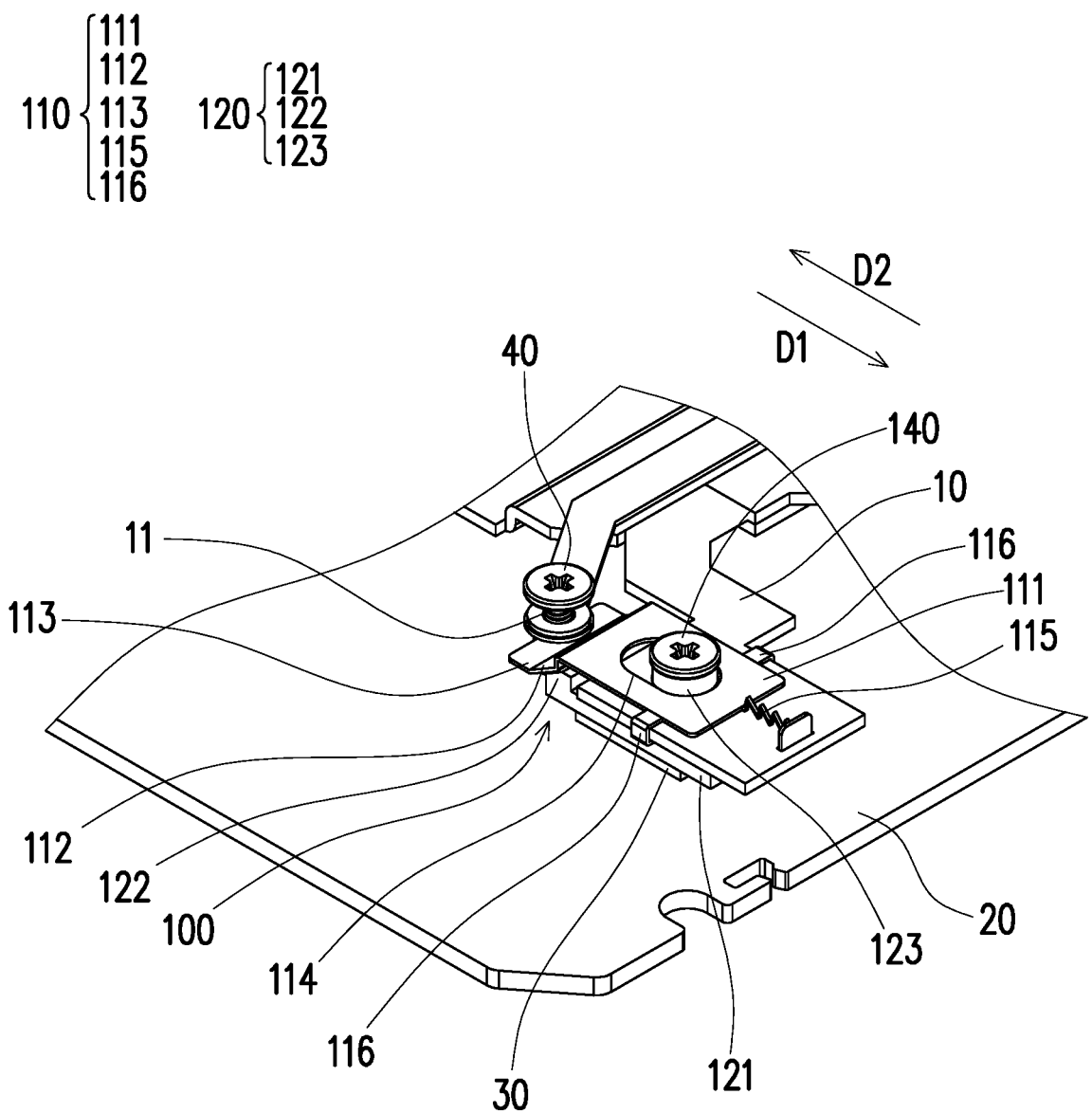
Figure 3:
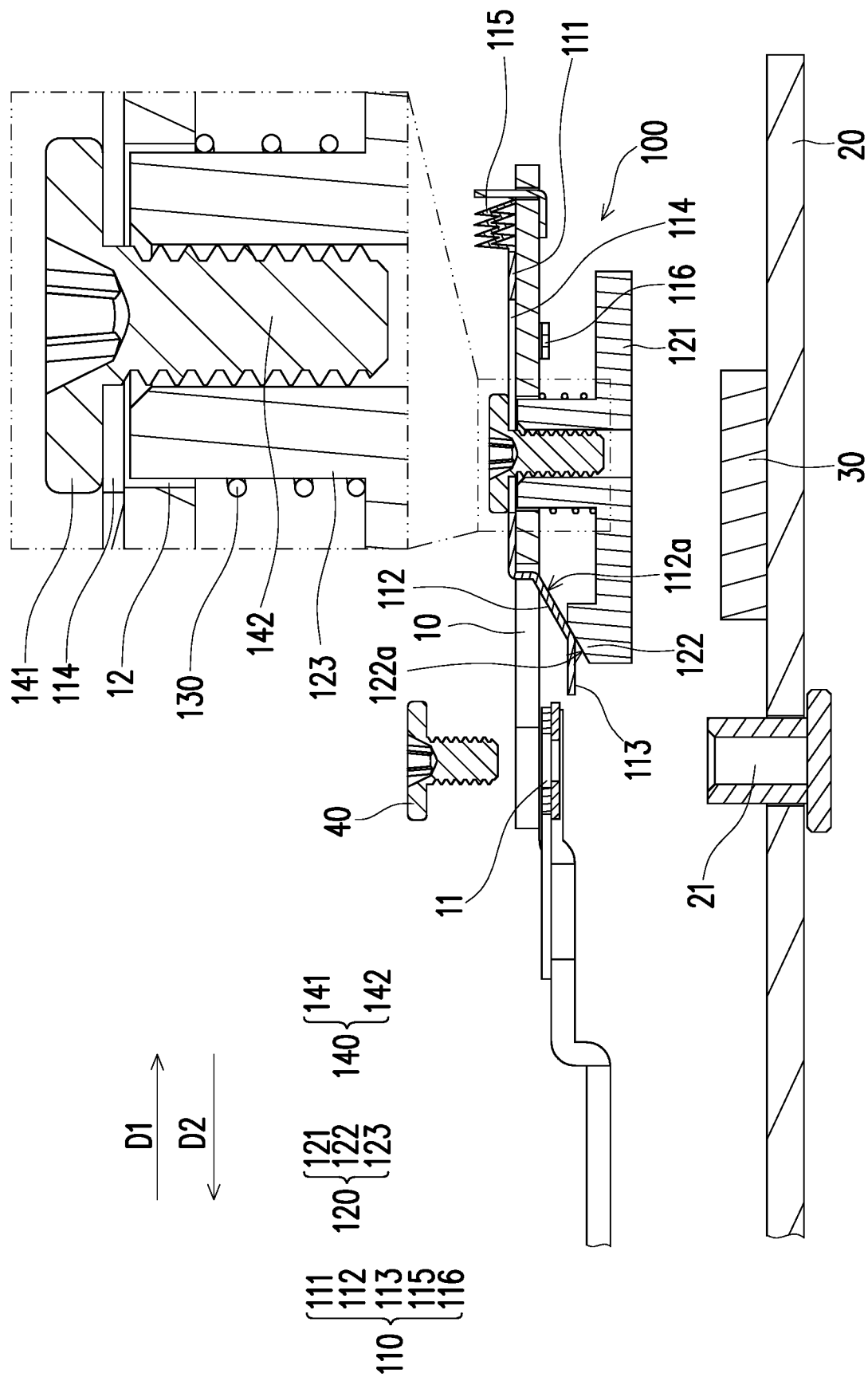
FIG. 3 is a cross-sectional schematic view of FIG. 1.
Figure 4:
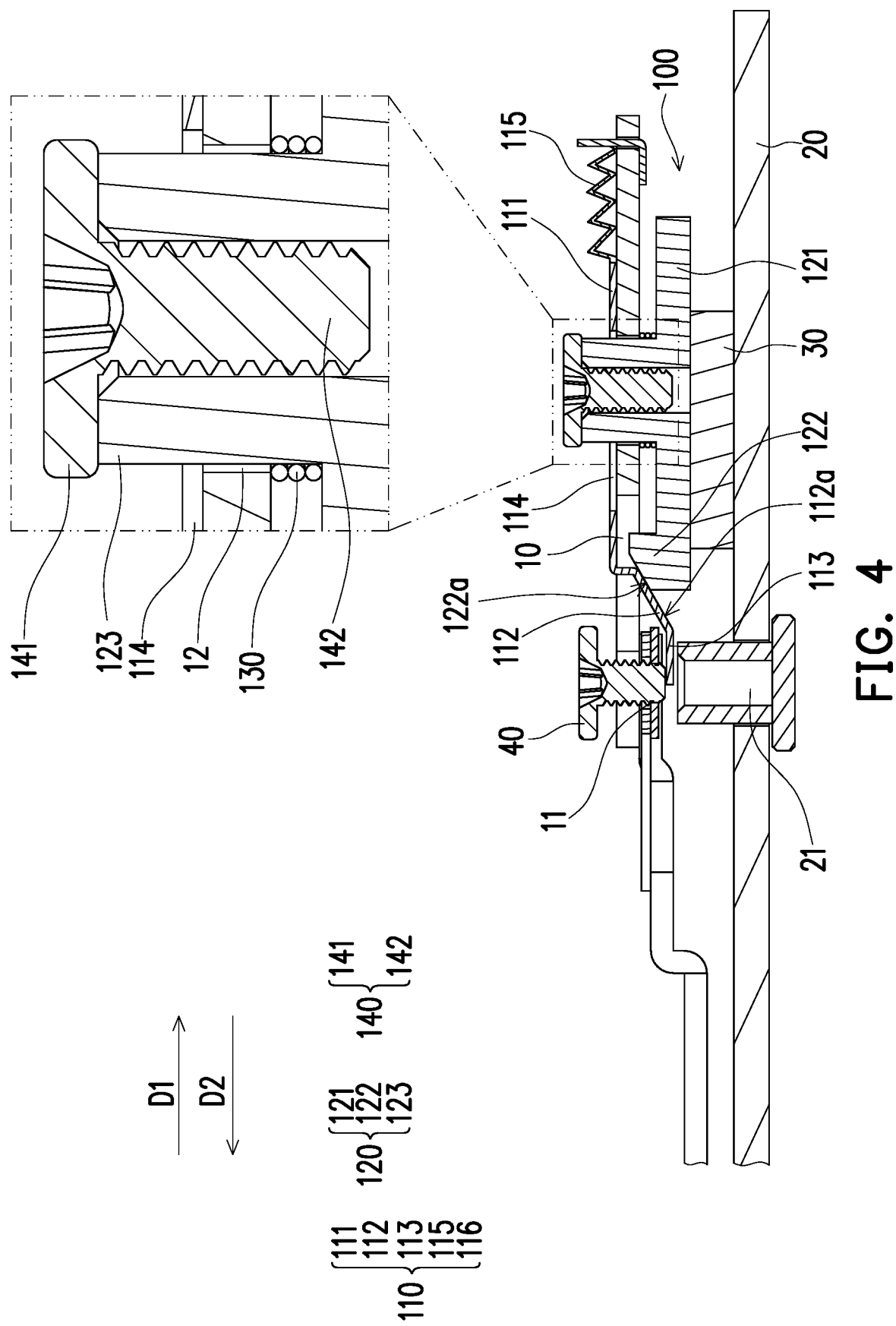
FIG. 4 is a cross-sectional schematic view of FIG. 2.

FIG. 1 and FIG. 2 are partial schematic views of a positioning fixture configured to assist in the installation of a functional module and a circuit board according to an embodiment of the disclosure. FIG. 3 is a cross-sectional schematic view of FIG. 1. FIG. 4 is a cross-sectional schematic view of FIG. 2. Referring to FIG. 1 to FIG. 4, in this embodiment, a positioning fixture 100 is suitable for auxiliary installation of a functional module 10 on the circuit board 20, in which the circuit board 20 includes an electronic component 30 and a first screw hole 21, and the electronic component 30 is disposed adjacent to the first screw hole 21. The functional module 10 includes a second screw hole 11, and the second screw hole 11 corresponds to the first screw hole 21. For example, the functional module 10 may be a heat dissipation module, but not limited thereto.

The positioning fixture 100 is disposed on the functional module 10 and includes a shielding member 110, a driving member 120 and a spring 130. Specifically, the shielding member 110 includes a sliding part 111 slidably connected to the functional module 10, a guiding part 112 connected to the sliding part 111, and a shielding part 113 connected to the guiding part 112. The guiding part 112 is located between the sliding part 111 and the shielding part 113, and the shielding part 113 extends toward the first screw hole 21 and the second screw hole 11. Furthermore, the sliding part 111 extends from one end of the guiding part 112 along a first direction D1, and the shielding part 113 extends from another end of the guiding part 112 along a second direction D2 opposite to the first direction D1 and corresponds to the first screw hole 21.

As shown in FIG. 3 and FIG. 4, at least a part of the sliding part 111 contacts the functional module 10, and the guiding part 112 and the shielding part 113 are separated from the functional module 10. In addition, the positioning fixture 100 may slide relative to the functional module 10, so that the shielding part 113 may slide close to the second screw hole 11, or slide away from the second screw hole 11. On the other hand, the driving member 120 is movably disposed on the functional module 10 corresponding to the shielding member 110. The sliding direction of the sliding part 111 and the moving direction of the driving member 120 are different, for example, the directions thereof are perpendicular to each other. The driving member 120 includes a base part 121, a driving part 122 connected to the base part 121, and a pillar part 123 protruding from the base part 121, and the driving part 122 contacts the guiding part 112 of the shielding member 110. Furthermore, the driving member 120 is adapted to be pushed toward the functional module 10, and the guiding part 112 is pushed by the driving part 122, to drive the shielding member 110 to slide close to the first screw hole 21 and the second screw hole 11 along the second direction D2. In this embodiment, the driving member 120 is movably disposed on the functional module 10 along a direction perpendicular to the second direction D2, that is, the driving member 120 may come close to or be far away from the functional module 10.

In this embodiment, the sliding part 111 has a guiding groove 114, and the functional module 10 has a through hole 12 aligned with the guiding groove 114. The pillar part 123 extends toward the guiding groove 114. In an installation state as shown in FIG. 3, the pillar part 123 is inserted into the through hole 12 of the functional module 10. When the base part 121 of the driving member 120 moves toward the sliding part 111 of the shielding member 110, the pillar part 123 passes through the through hole 12 of the functional module 10 and the guiding groove 114 of the sliding part 111, as shown in FIG. 4.

As shown in FIG. 3 and FIG. 4, the spring 130 may be a compression spring, the spring 130 is sleeved on the pillar part 123, and two ends of the spring 130 respectively contact the functional module 10 and the base part 121 of the driving member 120. Furthermore, the functional module 10 and the circuit board 20 are respectively applied to different models. During the process of installing the functional module 10 on the circuit board 20, an electronic component 30 on the circuit board 20 is placed on the installation path of the positioning fixture 100. When the functional module 10 is positioned on the circuit board 20, the base part 121 of the driving member 120 contacts the electronic component 30 and is pushed toward the functional module 10 by the electronic component 30. At the same time, the driving part 122 of the driving member 120 pushes the guiding part 112, so that the shielding member 110 slides relative to the functional module 10 along the second direction D2, and the shielding part 113 slides to shield the first screw hole 21 of the circuit board 20, to block between the first screw hole 21 and the second screw hole 11.

When the shielding part 113 of the shielding member 110 blocks between the first screw hole 21 and the second screw hole 11, not only that a screw 40 passing through the second screw hole 11 of the functional module 10 cannot be further locked into the first screw hole 21 of the circuit board 20, but also the installer can detect an incorrect installation, thereby improving the installation accuracy and reducing the probability of damaging the functional module 10 and the circuit board 20 caused by an incorrect installation. That is, when the screw 40 passing through the second screw hole 11 of the functional module 10 cannot be further locked into the first screw hole 21 of the circuit board 20, the installer may figure out that the functional module 10 and the circuit board 20 belong to different models and immediately stop the action of forcibly locking the functional module 10 onto the circuit board 20, to prevent the functional module 10 and the electronic component 30 on the circuit board 20 from pushing each other and deforming.

As shown in FIG. 4, when the base part 121 of the driving member 120 is pushed toward the sliding part 111 of the shielding member 110, the spring 130 is pressed by the base part 121, resulting in elastic deformation. Once the base part 121 of the driving member 120 moves away from the electronic component 30 on the circuit board 20, the elastic resilience of the spring 130 may push the driving member 120 back to the initial position shown in FIG. 3.

In contrast, during the process of installing the functional module 10 on a circuit board applied to the same model, the electronic component on the circuit board is placed outside of the installation path of the positioning fixture 100. When the functional module 10 and the positioning fixture 100 move toward the circuit board, the base part 121 of the driving member 120 will not contact the electronic component, so the driving member 120 and the shielding member 110 remain in their original states. As the shielding part 113 of the shielding member 110 does not block between the second screw hole 11 of the functional module 10 and the screw hole of the circuit board, the screw 40 passing through the second screw hole 11 of the functional module 10 may be smoothly locked into the screw hole of the circuit board.

Referring to FIG. 1 and FIG. 3, in order to prevent the positioning fixture 100 from detaching from the functional module 10 and to ensure the mechanical coupling relationship between the driving member 120 and the shielding member 110, the positioning fixture 100 further includes a screw member 140. The screw member 140 passes through the guiding groove 114 of the sliding part 111 from one side of the shielding member 110 opposite to the functional module 10 and is locked into the pillar part 123 of the driving member 120. Specifically, the screw member 140 includes a nut part 141 and a screw thread part 142 connected to the nut part 141. The sliding part 111 of the shielding member 110 is located between the nut part 141 and the functional module 10, and the screw thread part 142 is locked into the pillar part 123.

Figure 5:
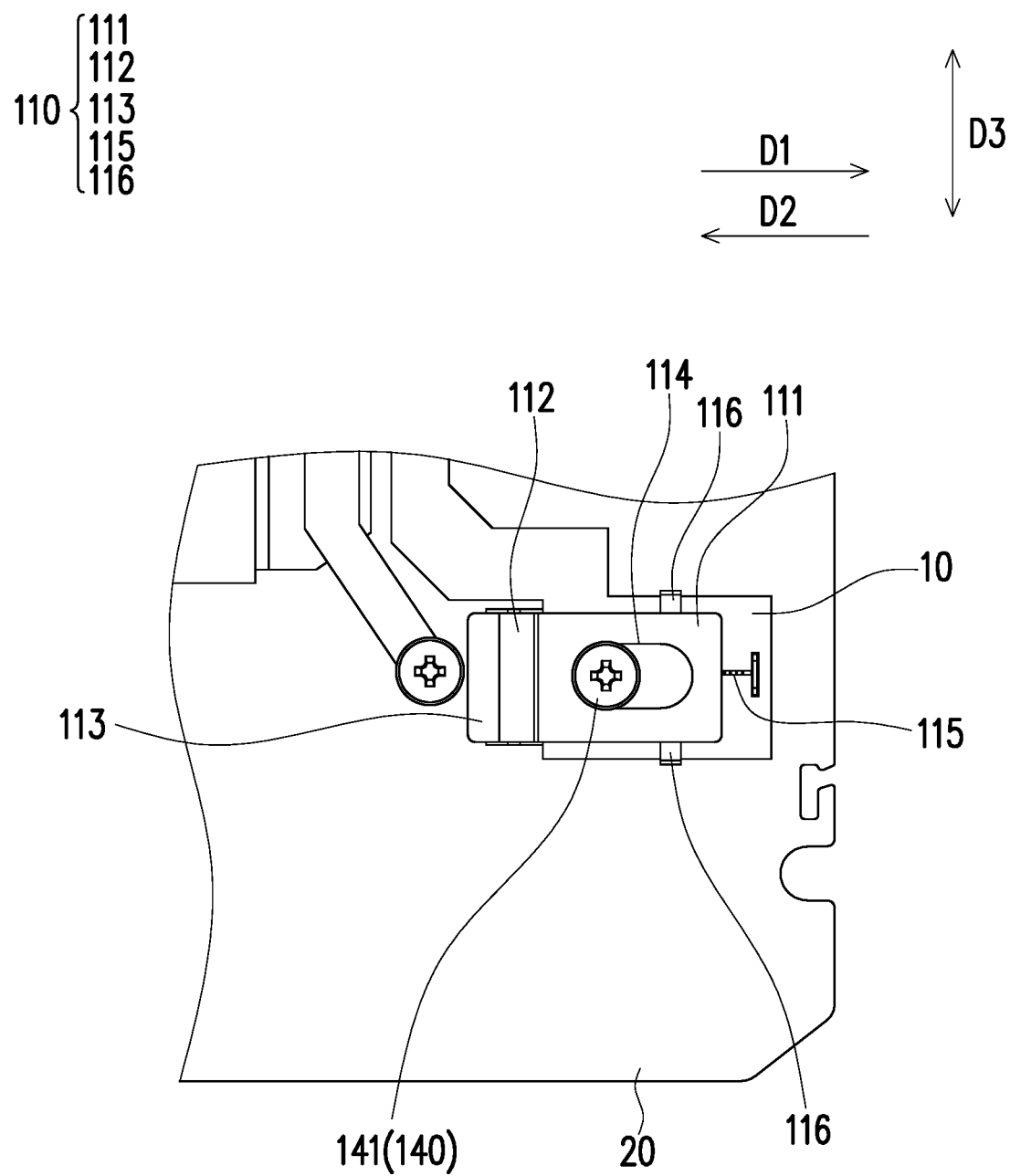
FIG. 5 is a top schematic view of FIG. 1.

FIG. 5 is a top schematic view of FIG. 1. Referring to FIG. 3 to FIG. 5, in a third direction D3 perpendicular to the first direction D1 or the second direction D2, the outer diameter of the nut part 141 of the screw member 140 is larger than the inner diameter of the guiding groove 114. During the process that the base part 121 of the driving member 120 moves away from the shielding part 113 of the shielding member 110 along the first direction D1, once the nut part 141 of the screw member 140 contacts the sliding part 111, the driving member 120 immediately stops moving without detaching from the shielding member 110. In addition, the extension length of the guiding groove 114 is greater than the outer diameter of the pillar part 123, so that the pillar part 123 may pass through the guiding groove 114 and slide in the guiding groove 114.

On the other hand, the extending direction of the guiding groove 114 is parallel to the first direction D1 or the second direction D2. Based on the cooperation between the screw member 140 and the guiding groove 114 or the cooperation between the pillar part 123 of the driving member 120 and the guiding groove 114, the shielding member 110 may stably slide along the first direction D1 or the second direction D2, and the extending distance of the guiding groove 114 may substantially determine the sliding stroke of the shielding member 110.

Referring to FIG. 3 and FIG. 4, in this embodiment, the shielding member 110 further includes an elastic part 115. The two ends of the elastic part 115 are respectively connected to the sliding part 111 and the functional module 10, and the guiding part 112 and the elastic part 115 are respectively located on two opposite sides of the sliding part 111. For example, the elastic part 115 may be a tensile spring. As shown in FIG. 4, when the shielding part 113 of the shielding member 110 slides close to the second screw hole 11 of the functional module 10 and the first screw hole 21 of the circuit board 20 along the second direction D2, the elastic part 115 is stretched, resulting in elastic deformation. Once the driving member 120 moves away from the shielding member 110, the elastic resilience of the elastic part 115 may draw the shielding member 110 back to the initial position shown in FIG. 3.

Referring to FIG. 1, FIG. 2, and FIG. 5, the shielding member 110 further includes two positioning parts 116 connected to the sliding part 111, and the two positioning parts 116 are respectively located on two opposite sides of the guiding groove 114. Specifically, the two positioning parts 116 are slidably engaged to the functional module 10 to prevent the shielding member 110 from being detached from the functional module 10 and to improve the stability when the shielding member 110 slides along the first direction D1 or the second direction D2.

As shown in FIG. 3 and FIG. 4, the sliding part 111, the guiding part 112, and the shielding part 113 in sequence form a stepped structure. The guiding part 112 extends obliquely between the sliding part 111 and the shielding part 113, and has a guiding slope 112a facing the pillar part 123. In addition, the driving part 122 has a driving slope 122a facing away from the pillar part 123, the driving slope 122a contacts a guiding slope 112a, and the driving slope 122a and the guiding slope 112a are substantially parallel to each other, to improve the stability and smoothness of the driving part 122 and the guiding part 112 during relative sliding.

To sum up, the positioning fixture of the disclosure may be integrated on the functional module. Once the functional module that applies to a certain model is incorrectly installed on the circuit board that applies to another model, the positioning fixture may be driven by the electronic components on the circuit board to block between the screw hole of the functional module and the screw hole of the circuit board, preventing the screw that passes through the screw hole of the functional module from further being locked into the screw hole of the circuit board. That is, an incorrect installation may be detected by the installer through the positioning fixture of the disclosure, thereby improving the installation accuracy and reducing the probability of damaging the functional module and the circuit board caused by an incorrect installation.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and their equivalents and not by the above detailed descriptions.

What is claimed is:

1. A positioning fixture for positioning a functional module on a circuit board, said positioning fixture comprising:
   a shielding member, disposed corresponding to an electronic component on the circuit board, wherein the shielding member comprises a sliding part, a guiding part, and a shielding part, the sliding part is slidably connected to the functional module and extends from one end of the guiding part along a first direction, the shielding part extends from another end of the guiding part along a second direction opposite to the first direction and corresponds to a first screw hole on the circuit board, and the sliding part comprises a guiding groove; and
   a driving member, movably disposed on the functional module corresponding to the shielding member, wherein the driving member comprises a base part, a driving part and a pillar part, the driving part contacts the guiding part, the pillar part protrudes from the base part, and the pillar part passes through the guiding groove;
   wherein, during positioning of the functional module on the circuit board, the base part of the driving member is pushed by the electronic component, and the guiding part is pushed by the driving part, so that the shielding member slides along the second direction and the shielding part shields the first screw hole.

2. The positioning fixture according to claim 1, further comprising a spring, sleeved on the pillar part of the driving member, wherein two ends of the spring respectively contact the functional module and the base part of the driving member.

3. The positioning fixture according to claim 1, wherein the shielding part is further adapted to block between the first screw hole and a second screw hole on the functional module when the electronic component pushes the driving member.

4. The positioning fixture according to claim 1, wherein the shielding member further comprises two positioning parts connected to the sliding part and respectively located on two opposite sides of the guiding groove, and the two positioning parts are slidably engaged to the functional module.

5. The positioning fixture according to claim 1, wherein an extending direction of the guiding groove is parallel to the first direction.

6. The positioning fixture according to claim 1, wherein the shielding member further comprises an elastic part, two ends of the elastic part are respectively connected to the sliding part and the functional module, and the guiding part and the elastic part are respectively located on two opposite sides of the sliding part.

7. The positioning fixture according to claim 1, wherein the sliding part, the guiding part, and the shielding part in sequence form a stepped structure.

8. The positioning fixture according to claim 1, wherein the driving part comprises a driving slope which comprises a guiding slope, and the driving slope contacts the guiding slope.

9. The positioning fixture according to claim 1, further comprising a screw member locked into the pillar part from one side of the shielding member opposite to the functional module.

10. The positioning fixture according to claim 9, wherein the screw member comprises a nut part and a screw thread part, the sliding part is located between the nut part and the functional module, and the screw thread part is locked into the pillar part.

11. The positioning fixture according to claim 10, wherein an extension length of the guiding groove is greater than an outer diameter of the pillar part.

* * * * *